(12) United States Patent
Wang

(10) Patent No.: US 6,920,272 B2
(45) Date of Patent: Jul. 19, 2005

(54) MONOLITHIC TUNABLE LASERS AND REFLECTORS

(75) Inventor: Jian Wang, Orefield, PA (US)

(73) Assignee: NanoOpto Corporation, Somerset, NJ (US)

( * ) Notice: Subject to any disclaimer, the term of this patent is extended or adjusted under 35 U.S.C. 154(b) by 0 days.

(21) Appl. No.: 10/463,473

(22) Filed: Jun. 17, 2003

(65) Prior Publication Data

US 2004/0071425 A1 Apr. 15, 2004

Related U.S. Application Data

(60) Provisional application No. 60/417,230, filed on Oct. 9, 2002.

(51) Int. Cl.$^7$ .................................... G02B 6/10
(52) U.S. Cl. ........................... 385/129; 359/332
(58) Field of Search .................. 385/123, 129–131, 385/140

(56) References Cited

U.S. PATENT DOCUMENTS

| | | |
|---|---|---|
| 4,615,034 A | 9/1986 | von Gunten et al. |
| 4,638,669 A | 1/1987 | Chou |
| 4,650,289 A | 3/1987 | Kuwahara |
| 4,732,444 A | 3/1988 | Papuchon et al. |
| 4,763,972 A | 8/1988 | Papuchon et al. |
| 4,778,234 A | 10/1988 | Papuchon et al. |
| 4,998,793 A | 3/1991 | Henry et al. |
| 5,077,816 A | 12/1991 | Glomb et al. |
| 5,088,105 A | 2/1992 | Scifres et al. |
| 5,091,981 A | 2/1992 | Cunningham |
| 5,283,845 A | 2/1994 | Ip |
| 5,299,212 A | 3/1994 | Koch et al. |
| 5,461,246 A | 10/1995 | Chou |
| 5,467,415 A | 11/1995 | Presby |
| RE35,337 E | 9/1996 | Patel et al. |
| 5,617,234 A | 4/1997 | Koga et al. |
| 5,654,818 A | 8/1997 | Yao |
| 5,691,989 A | 11/1997 | Rakuljic et al. |
| 5,706,301 A | 1/1998 | Lagerstrom |
| 5,719,976 A | 2/1998 | Henry et al. |
| 5,726,805 A | 3/1998 | Kaushik et al. |
| 5,772,905 A | 6/1998 | Chou |
| 5,777,793 A | 7/1998 | Little et al. |
| 5,793,784 A | 8/1998 | Wagshul et al. |
| 5,820,769 A | 10/1998 | Chou |
| 5,848,080 A | 12/1998 | Dahm |
| 5,852,688 A | 12/1998 | Brinkman et al. |
| 5,870,421 A | 2/1999 | Dahm |
| 5,956,216 A | 9/1999 | Chou |

(Continued)

OTHER PUBLICATIONS

Austin, M., et al., "Fabrication for nanocontacts for molecular devices using nanoimprint lithography," J. Vac. Sci. Technol. B 20(2), Mar./Apr. 2002, pp. 665–667.

(Continued)

*Primary Examiner*—Akm Enayet Ullah
*Assistant Examiner*—Jennifer Doan
(74) *Attorney, Agent, or Firm*—Reed Smith LLP (57) ABSTRACT

A wavelength tunable device for operating on at least a portion of energy propagating through a waveguide is disclosed. The wavelength tunable device includes an upper cladding and a lower cladding having a core substantially disposed there between and suitable for optically coupling to the waveguide, a pattern of nanostructures positioned substantially on the upper cladding distal to the core so as to define a reflectivity for energy propagating through the waveguide, and, a movable membrane aligned with the pattern of nanostructures so as to at least partially define a gap there between. This gap may be selectively controlled upon actuation of the movable membrane so as to cause a corresponding change in the reflectivity.

39 Claims, 3 Drawing Sheets

U.S. PATENT DOCUMENTS

| | | | |
|---|---|---|---|
| 5,966,483 | A | 10/1999 | Chowdhury |
| 5,973,316 | A | 10/1999 | Ebbesen et al. |
| 5,973,784 | A | 10/1999 | Szwaykowski et al. |
| 6,035,089 | A | 3/2000 | Grann et al. |
| 6,037,644 | A | 3/2000 | Daghighian et al. |
| 6,040,936 | A | 3/2000 | Kim et al. |
| 6,052,238 | A | 4/2000 | Ebbesen et al. |
| 6,064,506 | A | 5/2000 | Koors |
| 6,069,380 | A | 5/2000 | Chou et al. |
| 6,075,915 | A | 6/2000 | Koops et al. |
| 6,101,300 | A | 8/2000 | Fan et al. |
| 6,122,103 | A | 9/2000 | Perkins et al. |
| 6,122,301 | A | 9/2000 | Tei et al. |
| 6,125,220 | A | 9/2000 | Copner et al. |
| 6,130,969 | A | 10/2000 | Villeneuve et al. |
| 6,137,939 | A | 10/2000 | Lesesky et al. |
| 6,154,318 | A | 11/2000 | Austin et al. |
| 6,154,479 | A | 11/2000 | Yoshikawa et al. |
| 6,169,825 | B1 | 1/2001 | Morey et al. |
| 6,175,667 | B1 | 1/2001 | Wang et al. |
| 6,191,890 | B1 | 2/2001 | Baets et al. |
| 6,198,557 | B1 | 3/2001 | Dultz et al. |
| 6,198,860 | B1 | 3/2001 | Johnson et al. |
| 6,208,463 | B1 | 3/2001 | Hansen et al. |
| 6,215,928 | B1 | 4/2001 | Friesem et al. |
| 6,233,375 | B1 | 5/2001 | Lang et al. |
| 6,233,380 | B1 | 5/2001 | Ferrieu |
| 6,235,141 | B1 | 5/2001 | Feldman et al. |
| 6,240,109 | B1 | 5/2001 | Shieh |
| 6,251,297 | B1 | 6/2001 | Komuro et al. |
| 6,252,709 | B1 | 6/2001 | Sato |
| 6,253,009 | B1 | 6/2001 | Lestra et al. |
| 6,260,388 | B1 | 7/2001 | Borrelli et al. |
| 6,262,002 | B1 | 7/2001 | Carey |
| 6,263,002 | B1 | 7/2001 | Hsu et al. |
| 6,275,291 | B1 | 8/2001 | Abraham et al. |
| 6,285,810 | B1 | 9/2001 | Fincato et al. |
| 6,288,840 | B1 | 9/2001 | Perkins et al. |
| 6,309,580 | B1 | 10/2001 | Chou |
| 6,317,554 | B1 | 11/2001 | Kosaka et al. |
| 6,324,192 | B1 | 11/2001 | Tayebati |
| 6,339,603 | B1 | 1/2002 | Flanders et al. |
| 6,349,103 | B1 | 2/2002 | Chung et al. |
| 6,353,623 | B1 | 3/2002 | Munks et al. |
| 6,359,915 | B1 | 3/2002 | Koch et al. |
| 6,370,177 | B1 | 4/2002 | Genei et al. |
| 6,371,662 | B1 | 4/2002 | Leard et al. |
| 6,374,016 | B2 | 4/2002 | Albert et al. |
| 6,400,860 | B1 | 6/2002 | Chandrasekhar et al. |
| 6,410,416 | B1 | 6/2002 | Dodabalapur et al. |
| 6,482,742 | B1 | 11/2002 | Chou |
| 6,518,189 | B1 | 2/2003 | Chou |
| 6,614,977 | B2 * | 9/2003 | Johnson et al. ............. 385/129 |
| 6,618,104 | B1 | 9/2003 | Date et al. |
| 6,650,816 | B2 * | 11/2003 | Bazylenko et al. ......... 385/129 |
| 6,661,952 | B2 | 12/2003 | Simpson et al. |
| 6,692,797 | B1 | 2/2004 | Owen et al. |
| 6,713,238 | B1 | 3/2004 | Chou et al. |
| 6,741,628 | B2 * | 5/2004 | Painter et al. ................ 372/92 |

OTHER PUBLICATIONS

Austin, M., et al., "Fabrication of 70nm channel length polymer organic thin–film transistors using nanoimprint lithography," Appl. Phys. Lett. 81 (23), Dec. 2, 2002, pp. 4431–4433.

Bird, G.R. et al., "The Wire Grid as a Near–Infrafed Polarizer," J. of the Optical Soc. of America, 50 (9), 886–890, (1960).

Born, Max, and Wolf, Emil: Principles of Optics: Electromagnetic Theory of Propagation, Interference and Diffraction of Light 7th ed. Oct. 1, 1999, Cambridge University Press. p. 790.

Brundrett, D. L.., et al., "Normal–incidence guided–mode resonant grating filters: design and experimental demonstration" Optics Lett., May 1, 1998;23(9):700–702.

Cao, H., et al., "Fabrication of 10 nm enclosed nanofluidic channels," Appl. Phys. Lett. 81 (1), Jul. 1, 2002, pp. 174–176.

Cao, H., et al., "Gradient Nanostructures for interfacing microfluidics and nanofluidics," Appl. Phys. Lett. 81(16), Oct. 14, 2002, pp. 3058–3060.

Chang, Allan S. P., et al. "A new two–dimensional subwavelength resonant grating filter fabricated by nanoimprint lithography" Department of Electrical Engineering, Nano-Structures Laboratory, Princeton University.

Chigrin, D. N.,et al., "Observation of total omnidirectional reflection from a one–dimensional dielectric lattice" Appl. Phy. A. 1999;68:25–28.

Chou, S. Y., et al., "Subwavelength transmission gratings and their applications in VCSELs" Proc. SPIE. 1997;3290:73–81.

Chou, S. Y., et al., "Observation of Electron Velocity Overshoot in Sub–100–nm–channel MOSFET's in Silicon," IEEE Electron Device Letters, vol. EDL–6, No. 12, Dec. 1985, pp. 665–667.

Chou, S.Y., et al., "Imprint Lithography with 25–Nanometer Resolution" Apr. 5, 1996;272(5258):85–87.

Chou, S.Y., et al., "Sub–10 nm imprint lithography and applications" J. Vac. Sci. Technol. B. 1997 Nov./Dec.;15(6):2897–2904.

Chou, S., et al., "Imprint of sub–25 nm vias and trenches in polymers," Appl. Phys., Lett. 67 (21), Nov. 20, 1995, pp. 3114–3116.

Chou, S., et al., "Lateral Resonant Tunneling Transistors Employing Field–Induced Quantum Wells and Barriers," Proceedings of the IEEE, vol. 79, No. 8, Aug. 1991, pp. 1131–1139.

Chou, S., et al., "Nanoscale Tera–Hertz Metal–Semiconductor–Metal Photodetectors," IEEE Journal of Quantum Electronics, vol. 28, No. 10, Oct. 1992, pp. 2358–2368.

Chou, S., et al., "Ultrafast and direct imprint of nanostructures in silicon," Nature, vol. 417, Jun. 20, 2002, pp. 835–837.

Chou, S., G.A., "Patterned Magnetic Nanostructures and Quantized Magnetic Disks," Proceedings of the IEEE, vol. 85, No. 4, Apr. 1997, pp. 652–671.

Cui, B., et al., "Perpendicular quantized magnetic disks with 45 Gbits on a 4 x 2 $cm^2$ area," Journal of Applied Physics, vol. 85, No. 8, Apr. 15, 1999, pp. 5534–5536.

Deshpande, P., et al., "Lithographically induced self–assembly of microstructures with a liquid–filled gap between the mask and polymer surface," J. Vac. Sci. Technol. B 19(6), Nov./Dec. 2001, pp. 2741–2744.

Deshpande, P., et al., "Observation of dynamic behavior lithographically induced self–assembly of supromolecular periodic pillar arrays in a homopolymer film," Appl. Phys. Lett. 79 (11), Sep. 10, 2001, pp. 1688–1690.

Fan, S., et al., "Design of three–dimensional photonic crystals at submicron lengthscales" Appl. Phys. Lett. Sep. 12,1994;65(11)1466–1468.

Feiertag, G., et al., "Fabrication of photonic crystals by deep x–ray lithography" Appl. Phys. Lett., Sep. 15, 1997;71(11):1441–1443.

Fink, Y., et al, "Guiding optical light in air using an all–dielectric structure" J. Lightwave Techn. Nov. 1999;17(11):2039–2041.

Fink, Y., et al, "A dielectric omnidirectional reflector" Science. Nov. 27, 1998;282:1679–1682.

Fischer, P.B., et al., "10 nm electron beam lithography and sub–50 nm overlay using a modified scanning electron microscope," Appl. Phys. Lett. 62 (23), Jun. 7, 1993, pp. 2989–2991.

Flanders, D.C., "Submicrometer periodicity gratings as artificial anisotropic dielectrics," Appl. Phys. Lett. 42 (6), 492–494 (1983).

Gabathuler, W., et al., "Electro–nanomechanically wavelength–tunable integrated–optical bragg reflectors Part II: Stable device operation" Optics Communications. Jan. 1, 1998;145:258–264.

Gaylord, Thomas K., et al., "Analysis and applications of optical diffraction by gratings," Proc. IEEE. May 1985; 73(5):894–937.

Goeman, S., et al., "First demonstration of highly reflective and highly polarization selective diffraction gratings (GIRO– Gratings) for long–wavelength VCSEL's" IEEE Photon. Technol. Lett. Sep. 1998;10(9):1205–1207.

Hayakawa, Tomokazu, et al, "ARROW–B Type Polarization Splitter with Asymmetric Y–Branch Fabricated by a Self–Alignment Process," J. Lightwave Techn, 15(7), 1165–1170, (1997).

Hereth, R., et al, "Broad–band optical directional couplers and polarization splitter," J. Lightwave Techn., 7(6), 925–930, (1989).

Ho, K.M., et al., "Existance of a photonic gap in periodic dielectric structures" Dec. 17, 1990;65(25);3152–3155.

Ibanescu, M., et al., "An all–dielectric coaxial waveguide" Science. Jul. 21, 2000:289:415–419.

Joannopoulos, J.D., et al., "Photonic crystals: putting a new twist on light" Nature. Mar. 13, 1997(6621):143–149.

Kokubun, Y., et al, "Arrow–Type Polarizer Utilizing Form Birefringence in Multilayer First Cladding," IEEE Photon. Techn. Lett., 11(9), 1418–1420, (1993).

Kuksenkov, D. V., et al., "Polarization related properties of vertical–cavity surface–emitting lasers" IEEE J. of Selected Topics in Quantum Electronics. Apr. 1997;3(2):390–395.

Levi, B.G., "Visible progress made in three–dimensional photonic 'crystals" Physics Today, Jan. 1999;52(1):17–19.

Li, M., et al., "Direct three–dimensional patterning using nanoimprint lithography," Appl. Phys. Lett. 78 (21), May 21, 2001, pp. 3322–3324.

Li, M., et al., "Fabrication of circular optical structures with a 20 nm minimum feature using nanoimprint lithography," Appl. Phys. Lett. 76 (6), Feb. 7, 2000, pp. 673–675.

Magel, G.A., "Integrated optic devices using micromachined metal membranes" SPIE. Jan. 1996;2686:54–63.

Magnusson, R., et al., "New principle for optical filters" Appl. Phys. Lett. Aug. 31, 1992;61(9):1022–1023.

Mashev, L., et al., "Zero order anomaly of dielectric coated gratings" Optics Communications. Oct. 15, 1985; 55(6):377–380.

Moharam, M. G., et al., "Rigorous coupled–wave analysis of planar–grating diffraction" J. Opt. Soc. Am. Jul. 1981;71(7):811–818.

Mukaihara, T., et al., "Engineered polarization control of GaAs/AlGaAs surface emitting lasers by anisotropic stress from elliptical etched substrate hole" IEEE Photon. Technol. Lett. Feb. 1993;5(2);133–135.

Noda, S., et al., "New realization method for three–dimensional photonic crystal in optical wavelength region" Jpn. J. Appl. Phys. Jul. 15, 1996;35:L909–L912.

Oh, M., et al., "Polymeric waveguide polarization splitter with a buried birefringent polymer" IEEE Photon. Techn. Lett. Sep. 1999;11(9);1144–1146.

Painter, O., et al., "Lithographic tuning of a two–dimensional photonic crystal laser array" IEEE Photon. Techn. Lett., Sep. 2000;12(9):1126–1128.

Painter, O., et al., "Room temperature photonic crystal defect lasers at near–infrared wavelengths in InGaAsP" J. Lightwave Techn., Nov. 1999.;17(11):2082–2088.

Peng, S., et al., "Experimental demonstration of resonant anomalies in diffraction from two–dimensional gratings" Optical Lett. Apr. 15, 1996;21(8):549–551.

Ripin, D. J., et al., "One–dimensional photonic bandgap microcavities for strong optical confinement in GaAs and GaAs/AlxOy semiconductor waveguides" J. Lightwave Techn. Nov. 1999; 17(11):2152–2160.

Rokhinson, L.P., et al., "Double–dot charge transport in Si single–electron/hole transistors," Appl. Phys. Lett. 76 (12), Mar. 20, 2000, pp. 1591–1593.

Rokhinson, L.P., et al., "Kondo–like zero–bias anomaly in electronic transport through an ultrasmall Si quantum dot," Physical Review B, vol. 60, No. 24, Dec. 15, 1999, pp. 319–321.

Rokhinson, L.P., et al., "Magnetically Induced Reconstruction of the Ground State in a Few–Electron Si Quantum Dot," Physical Review Letters, vol. 87, No. 16, Oct. 15, 2001, pp. 1–3.

Rudin, A., et al., "Charge–ring model for the charge–induced confinement enhancement in stacked quantum–dot transistors," Appl. Phys. Lett. 73(23), Dec. 7, 1998, pp. 3429–3431.

Russell, P. St. J., et al., "Full photonic bandgaps and spontaneous emission control in 1D multilayer dielectric structures" Opt. Commun. Feb. 1, 1999;160:66–71.

Rytov, S. M., "Electromagnetic properties of a finely stratified medium" Soviet Physics JETP (Journal of Experimental & Theoretical Physics). May 1956;2(1):466–475.

Schablitsky, S., et al., "Controlling polarization of vertical–cavity surface–emitting lasers using amorphous silicon subwavelength transmission gratings," Appl. Phys. Lett. 69 (1), Jul. 1, 1996, pp. 7–9.

Sharon, A., et al., "Narrow spectral bandwidths with grating waveguide structures" Appl. Phys. Lett. Dec. 30, 1996;69(27):4154–4156.

Sugimoto, Y., et al., "Experimental verification of guided modes in 60 degrees –bent defect waveguides in AlGaAs–based air–bridge–type two–dimensional photonic crystal slabs" J. Appl. Phys. Mar. 1, 2002; 91(5):3477–3479.

Sun, X., et al., "Multilayer resist methods for nanoimprint lithography on nonflat surfaces" J. Vac. Sci. Technol. B. Nov./Dec. 1998;16(6)3922–3925.

Tibuleac, S., et al., "Reflection and transmission guided–mode resonance filters" J. Opt. Soc. Am. A. Jul. 1997:14(7):1617–1626.

Trutschel, U., et al, "Polarization splitter based on anti–resonant reflecting optical waveguides," J Lightwave Techn., 13(2), 239–243, (1995).

Tyan, R.C., et al., "Design, fabrication and characterization of form–birefringent multilayer polarizing beam splitter" J. Opt. Soc. Am. A. Jul. 1997;14(7):1627–1636.

Tyan, R. et al., "Polarizing beam splitters constructed of form–birefringent multilayer gratings," SPIE 2689, 82–89.

van Blaaderenm, Alfons, "Opals in a New Light" Science. Oct. 30, 1998;282(5390):887–888.

van Doorn, A. K. Jansen, et al., "Strain–induced birefringence in vertical–cavity semiconductor lasers" IEEE J. Quantum Electronics. Apr. 1998:34(4):700–706.

Vellekoop, A.R. et al, "A small–size polarization splitter based on a planar phase optical phased array," J Lightwave Techn., 8(1), 118–124, (1990).

Wang, J., et al., "Molecular alignment in submicron patterned polymer matrix using nano–imprint lithography," Appl. Phys. Lett. 77 (2), Jul. 10, 2000, pp. 166–168.

Wang, J., et al., "Fabrication of a new broadband waveguide polarizer with a double–layer 190 nm period metal–gratings using nanoimprint lithography" J. Vac. Sci. Technol. B. Nov. Dec. 1999:17(6):2957–2960.

Wang, S. S., et al., "Design of waveguide–grating filters with symmetrical line shapes and low sidebands" Opt. Lett. Jun. 15, 1994;19(12):919–921.

Wang, S. S., et al., "Guided–mode resonances in planar dielectric–layer diffraction gratings" J. Opt. Soc. Am. A. Aug. 1990;7(8):1470–1475.

Weber, M. F., Stover, C.A., Gilbert, L.R., Nevitt, T.J., Ouderkirk, A.J. "Giant birfringent optics in multilayer polymer mirrors," Science, 287, 2451–2456, Mar. 31, 2000.

Winn, J. N., et al., "Omnidirectional reflection from a one–dimensional photonic crystal" Opt. Lett. Oct. 15, 1998;23(20):1573–1575.

Wu., L., et al., "Dynamic modeling and scaling of nanostructure formation in the lithographically induced self-assembly and self–construction" Appl. Phys. Lett. 2003 May 12, 2003;82(19):3200–3202.

Yablonovitch, E., "Inhibited spontaneous emission in solild–state physics and electronics" Phys. Rev. Lett. May 18, 1987;58(20):2059–2062.

Yablonovitch, E., et al., "Photonic band structure: The face–centered–cubic case employing nonspherical atoms" Phys. Rev. Lett. Oct. 21, 1991; 67(17):2295–2298.

Yanagawa, H., et al,, "High extinction guided–wave optical polarization splitter," IEEE Photon. Techn. Lett., 3(1), 17–18, (1991).

Yoshikawa, T., et al., "Polarization–controlled single–mode VCSEL" IEEE J. Quantum Electronics. Jun. 1998;34(6):1009–1015.

Yu, Z., et al., "Reflective polarizer based on a stacked double–layer subwavelength metal grating structure fabricated using nanoimprint lithography," Appl. Phys. Lett. 77 (7), Aug. 14, 2000, pp. 927–929.

Zakhidov, A.A., et al., "Carbon structures with three–dimensional periodicity at optical wavelengths" Science. Oct. 30, 1998; 282(5390):897–901.

* cited by examiner

MONOLITHIC TUNABLE LASERS AND REFLECTORS

CROSS REFERENCE TO RELATED APPLICATIONS

This application claims the benefit of U.S. Provisional Application No. 60/417,230, filed Oct. 9, 2002, entitled "MONOLITHIC TUNABLE LASERS AND REFLECTORS", with the named inventor Jian Wang.

FIELD OF THE INVENTION

The present invention relates generally to waveguides, and particularly to monolithic tunable lasers and reflectors.

BACKGROUND OF THE INVENTION

In the field of optical networking, telecommunications, optical applications and photonics it is highly desirable to continually enhance device performance and reduce fabrication, packaging and assembly costs. Accordingly, multi-functional photonic components or photonic components exhibiting enhanced functionality are highly desirable.

Super-grating distributed Bragg reflector tunable lasers and sampled/chirped grating distributed Bragg reflector tunable lasers both usually require special fabrication techniques to make the distributed Bragg reflector gratings and usually require tuning through carrier injection. Current and temperature tuned distributed Bragg reflector tunable lasers and current and temperature tuned fixed distributed feedback/distributed Bragg reflector lasers usually have very small tuning ranges and difficult are to maintain.

Therefore, the need exists to have a monolithic tunable laser providing a larger tunable range and standard fabrication techniques.

SUMMARY OF THE INVENTION

A wavelength tunable device for operating on at least a portion of energy propagating through a waveguide is disclosed. The device includes an upper cladding and a lower cladding having a core substantially disposed there between and suitable for being optically coupled to the waveguide, a pattern of nanostructures positioned substantially on the upper cladding distal to the core so as to define a reflectivity for energy propagating through the waveguide, and a movable membrane aligned with the pattern of nanostructures so as to at least partially define a gap there between. The gap may be selectively controlled upon actuation of said movable membrane so as to cause a corresponding change in said reflectivity.

A monolithic tunable optical energy source suitable for emitting energy having at least one wavelength is also disclosed. The source includes a gain portion suitable for amplifying the energy to be emitted, at least a first reflector suitable for substantially reflecting the at least one wavelength including an upper cladding and a lower cladding having a core substantially disposed there between; a pattern of nanostructures positioned substantially on the upper cladding distal to said core so as to define a reflectivity for propagating energy; and a movable membrane aligned with the pattern of nanostructures so as to at least partially define a gap there between, wherein, the gap may be selectively controlled upon actuation of the movable membrane so as to cause a corresponding change in the reflectivity, and a waveguide portion substantially optically coupling the first reflector with the gain portion.

A waveguide module suitable for interacting with input energy propagation utilizing a wavelength tunable device is also disclosed. The waveguide module includes a waveguide wavelength demultiplexer suitable for dividing the energy propagation into parts, each part comprising approximately an equal wavelength portion of the energy propagation, and a plurality of reflectors suitable for interacting with the divided energy propagation, each reflector comprising an upper cladding and a lower cladding having a core substantially disposed there between and suitable for being optically coupled to the waveguide wavelength demultiplexer, a pattern of nanostructures positioned substantially on the upper cladding distal to said core so as to define a reflectivity for the energy propagating through the waveguide wavelength demultiplexer, and a movable membrane aligned with the pattern of nanostructures so as to at least partially define a gap there between, wherein the gap may be selectively controlled upon actuation of said movable membrane so as to cause a corresponding change in said reflectivity, thereby determining the add/drop characteristics of operating wavelength portion.

BRIEF DESCRIPTION OF THE FIGURES

Understanding of the present invention will be facilitated by consideration of the following detailed description of the preferred embodiments of the present invention taken in conjunction with the accompanying drawings, in which like numerals refer to like parts.

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for the purpose of clarity, many other elements found in typical photonic components and methods of manufacturing the same. Those of ordinary skill in the art will recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Active devices are devices that operate on signals such as creating emissions, filtering transmissions, balancing transmissions, splitting transmissions, and adding or dropping transmissions, for example. Passive devices are devices which are a transmission medium such a planar waveguides and fibers, for example.

Figure 1:
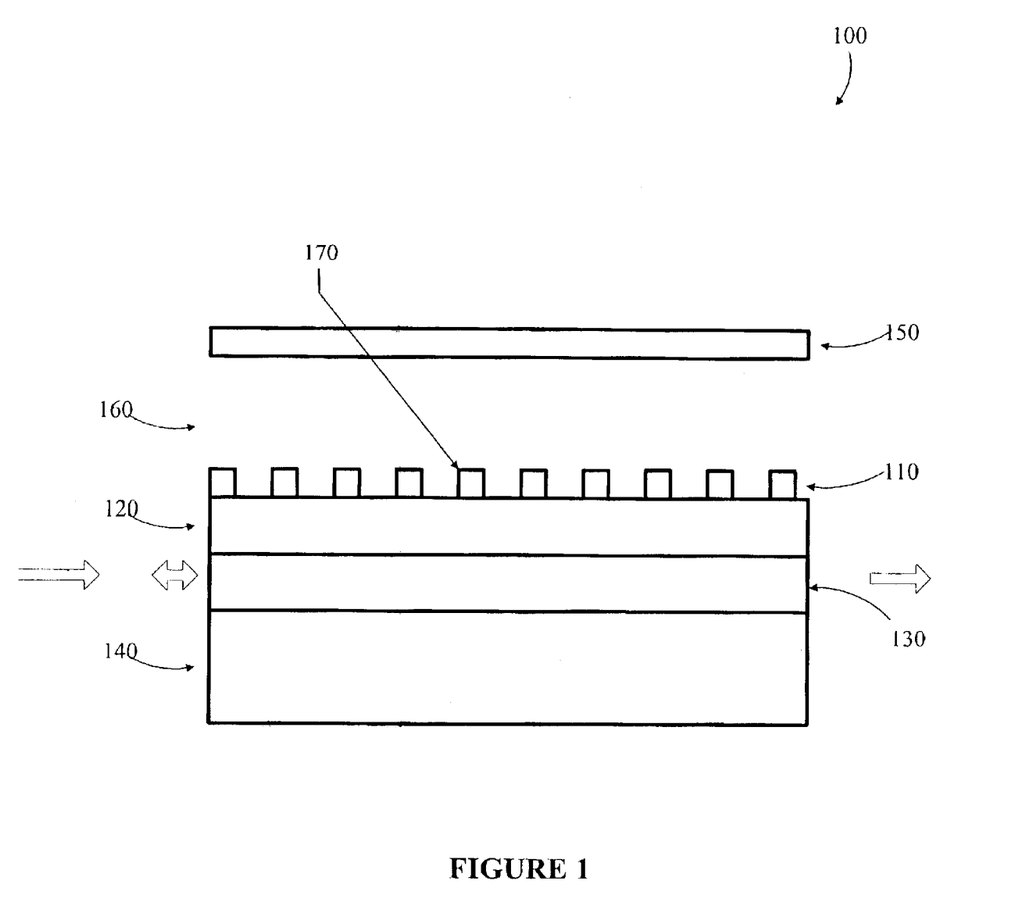
FIG. 1 illustrates a block representation of a tunable integrated Bragg reflector.

Referring now to FIG. 1, there is shown a tunable integrated Bragg reflector 100. Tunable integrated Bragg reflector 100 may include lower cladding layer 140 and upper cladding layer 120 and a core 130 therein between. A pattern of subwavelength elements, such as nanoelements and nanostructures 110, may be formed in a surface of upper cladding 120 substantially distal to core 130. A mechanically controllable membrane 150 may be placed near the pattern of nanostructures 110 with a gap 160 formed there between.

Pattern of nanostructures 110 may include multiple nanostructures 170 each having an element width $F_G$ and element height $D_G$. Pattern of nanostructures 110 may have a period of nanostructures 170, $X_G$. The filling ratio of pattern of nanostructures 110, denoted $F_G/X_G$, is the ratio of the width of a nanostructure $F_G$ to the overall period. Filling ratio, $F_G/X_G$, may determine the operating wavelength of device 10, as would be evident to one possessing an ordinary skill in the pertinent arts.

Pattern of nanostructures 110 may be formed into or onto upper cladding 120 using any suitable process for replicating, such as a lithographic process. For example, nanoimprint lithography consistent with that disclosed in U.S. Pat. No. 5,772,905, entitled NANOIMPRINT LITHOGRAPHY, the entire disclosure of which is hereby incorporated by reference as if being set forth in its entirety herein may be used. This patent teaches a lithographic method for creating ultra-fine nanostructure, such as sub 25 nm, patterns in a thin film coated on a surface. For purposes of completeness, a mold having at least one protruding feature may be pressed into the thin film applied to upper cladding. The at least one protruding feature in the mold creates at least one corresponding recess in the thin film. After replicating, the mold may be removed from the film, and the thin film processed such that the thin film in the at least one recess may be removed, thereby exposing an underlying pattern or set of devices. Thus, the patterns in the mold are replicated in the thin film, and then the patterns replicated into the thin film are transferred into the upper cladding 120 using a method known to those possessing an ordinary skill in the pertinent arts, such as reactive ion etching (RIE) or plasma etching, for example. Of course, any suitable method for forming a structure into or onto an operable surface, such as of upper cladding 120, may be utilized though, such as photolithography, holographic lithography, e-beam lithography, for example. Upper cladding 120 may take the form of InP, GaAs, or $SiO_2$ with a thin film of InGaAs, InGaAsP, AlGaAs, or Si forming pattern of nanostructures 110.

As will be recognized by those possessing ordinary skill in the pertinent arts, various patterns may be nanoimprinted onto upper cladding 120. These patterns may serve various optical or photonic functions. Such patterns may take the form of holes, strips, trenches or pillars, for example, all of which may have a common period or not, and may be of various heights and widths. The strips may be of the form of rectangular grooves, for example, or alternatively triangular or semicircular grooves. Similarly, pillars, basically the inverse of holes, may be patterned. The pillars may be patterned with a common period in both axes or alternatively by varying the period in one or both axes. The pillars may be shaped in the form of, for example, elevated steps, rounded semi-circles, or triangles. The pillars may also be shaped with one conic in one axis and another conic in the other.

According to an aspect of the present invention, an underlying one-dimensional (1-D) pattern of nanostructures 110, preferably formed of materials of having different reflective indices, may be formed on upper cladding 120. This 1-D pattern may be of the form of trenches, for example. According to an aspect of the present invention, two-dimensional (2-D) pattern of nanostructures 110, preferably formed of materials having different refractive indices, may be formed on upper cladding 120. This 2-D pattern may be of the form of pillars, for example.

Upper cladding 120, in combination, with lower cladding 140 envelops core 130. Upper cladding 120 may be substantially InP, GaAs, or $SiO_2$, for example. Lower cladding 140 may be substantially InP, GaAs, or $SiO_2$ for example. Core 130 may be substantially InGaAs or SiN.

Mechanically controllable membrane 150, such as a microelectromechanical system (MEMS) for example, may be placed in close proximity to pattern of nanostructures 110 with gap 160 substantially there between. MEMS are integrated micro devices or systems combining electrical and mechanical components, fabricated using integrated circuit processing techniques and may range in size from micrometers to millimeters. These systems may sense, control and actuate on the micro scale, and may function individually or in arrays to generate effects on the macro scale. The use of MEMS is known those possessing an ordinary skill in the pertinent arts.

In brief, a MEMS may include a base and a deflector. The base and deflector may be made from materials as is known to those possessing and ordinary skill in the pertinent arts, such as for example, InP, GaAs, SiN, Si, or $SiO_2$. The MEMS may operate wherein an application of energy to the MEMS causes a longitudinal deflection of the deflector with respect to the base. The longitudinal displacement of the deflector from the base is proportional to the energy applied to the MEMS.

Gap 160 may be created substantially between mechanically controlled membrane 150 and pattern of nanostructures 110. Gap 160 may include a material such as air or nitrogen or may be a vacuum, for example. The size of gap 160 may be in the range 0.1 um to 1 um, such as 0.3 um for example, which is the distance in the longitudinal direction between mechanically controlled membrane 150 and pattern of nanostructures 110.

Controlling the size of gap 160 by electro-mechanically actuating the deflector causes longitudinal displacement of the deflector with respect to the base. This control creates a tunable distributed Bragg reflector suitable for tunable wavelength selection.

Figure 2:
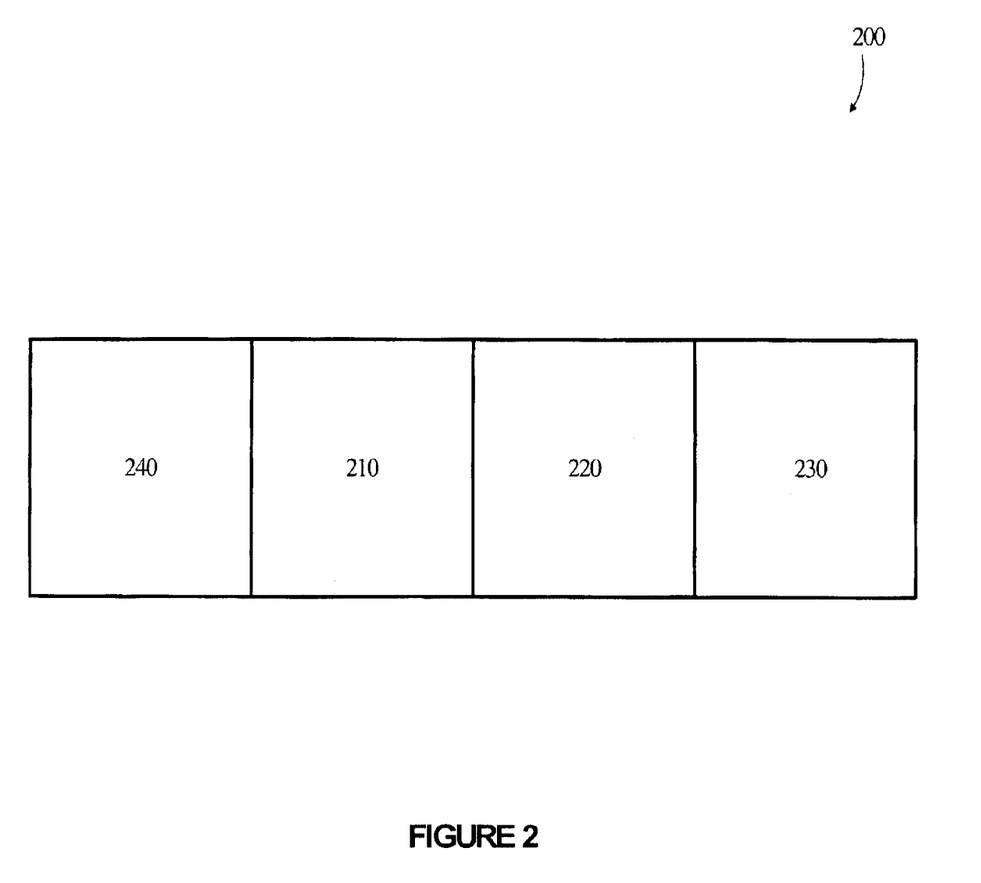
FIG. 2 illustrates a block representation of a monolithic tunable laser incorporating the tunable distributed Bragg reflector shown in FIG. 1; and, FIG. 3 illustrates a block representation of a waveguide add/drop module utilizing a tunable integrated Bragg reflector shown in FIG. 1.

Referring now to FIG. 2, there is shown a monolithic tunable laser 200. Monolithic tunable laser 200 includes a gain portion 210, a waveguide portion 220, a first reflector 230 and a second reflector 240. Gain portion 210 may be substantially optically coupled to first reflector 230 by waveguide portion 220. Second reflector 240 may be optically coupled to gain portion 210 distal to waveguide portion 220. Portion 210, 220, 230, 240 may be monolithically formed on a common substrate, such as InP, GaAs, or Si for example.

Gain portion 210, including for example a gain region, may include a Type III–V compound semiconductor, such as for example InP or GaAs. The performance and use of gain materials is known to those possessing an ordinary skill in the pertinent arts. Briefly, gain portion 210 may provide an area and configuration for population inversion and stimulated emission. Gain portion 210 operates to maintain more excited or pumped atoms in higher energy levels than atoms existing in the lower energy levels.

Waveguide portion 220, including for example a waveguide region, may be adapted to optically couple gain portion 210 to first reflector 230. The use of waveguides for optical coupling is known to those possessing an ordinary skill in the pertinent arts.

First reflector 230 may be designed to be tuned thereby selecting a desired stimulated emission of device 200. First reflector 230 may be a tunable integrated Bragg reflector 100

(FIG. 1), for example. First reflector 230 provides an optical feedback device by directing propagating energy back through gain portion 210.

Second reflector 240 may be adapted to provide simultaneous reflection and transmission by providing a small amount of transmission on the order of approximately 1% of the impinging radiation. Substantially the remainder of the impinging radiation may be reflected back through gain portion 210. Second reflector 240 may be designed as a tunable integrated Bragg reflector 100 (FIG. 1), for example, or alternatively may be designed to provide broadband reflection/transmission characteristics, thereby allowing first reflector 230 to be substantially determinative of the operating emitting wavelength.

In operation, gain portion 210 may be energized thereby exciting atoms from their lower state to one of several higher states. Energy, photons for example, of a wavelength selected by at least first reflector 230, and additionally, by second reflector 240, radiating between first reflector 230 and second reflector 240 pass through this population inverted portion thereby causing a stimulated emission. Second reflector 240 transmits a portion of the radiation incident upon it, thereby creating an emission of the wavelength selected by at least first reflector 230, and additionally, by second reflector 240.

Figure 3:
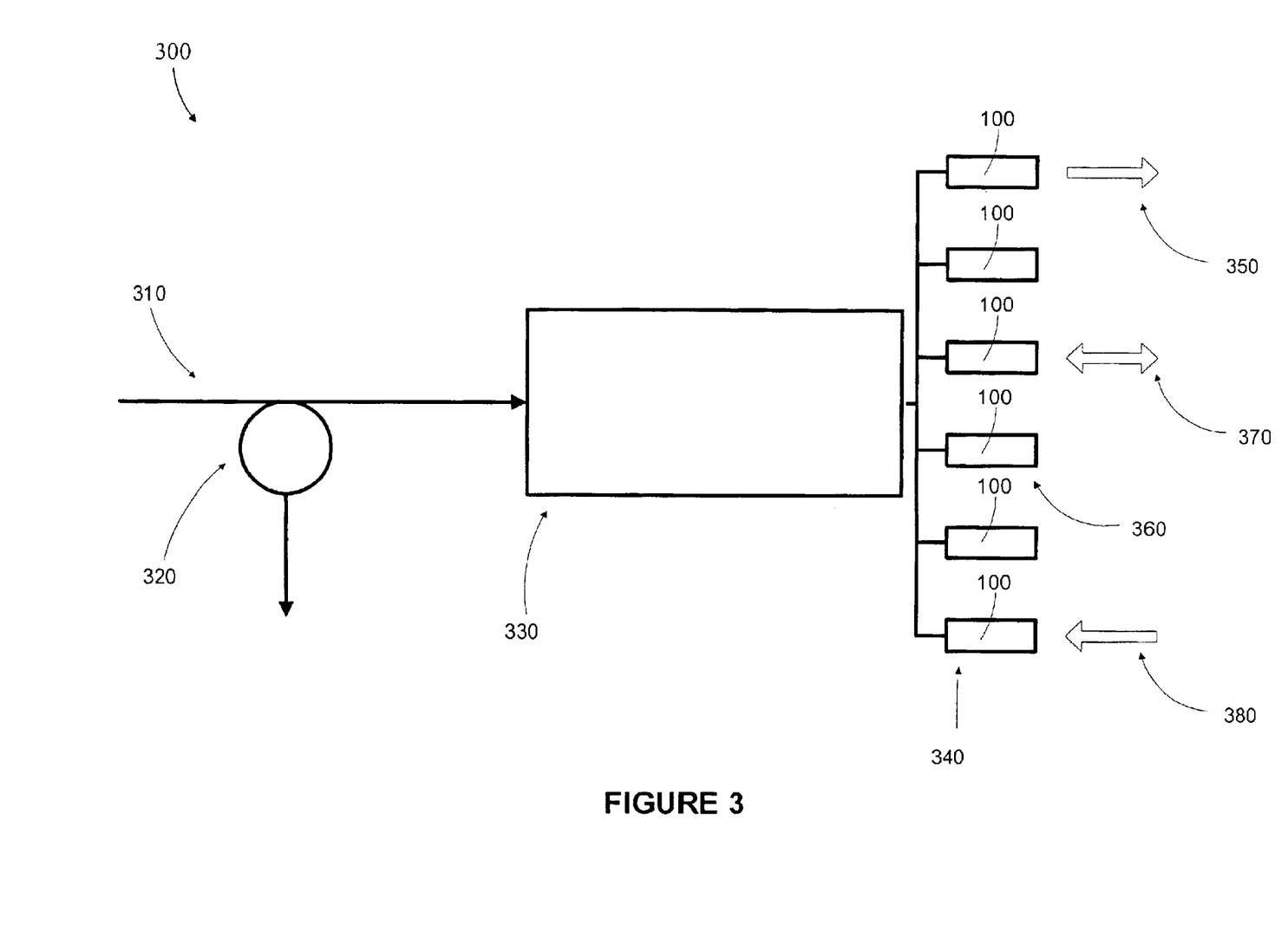

Referring now to FIG. 3, there is shown a waveguide add/drop module 300 utilizing tunable distributed Bragg reflector 100. The waveguide add/drop module 300 includes an optical fiber 310, circulator 320 for input and output coupling, a waveguide wavelength demultiplexer 330 and an array or plurality 340 of tunable distributed Bragg reflectors 100.

Circulator 320 may have a number of ports identified in a specific sequence. As in known to those possessing an ordinary skill in the pertinent arts, circulator 320 operates by substantially outputting energy input through one port through the next port in the sequence. For example, light of a certain wavelength enters circulator 320 through port x and exits through port x+1, while light of another wavelength enters through port x+2 and exits through x+3. For example, a circulator disclosed in U.S. Pat. No. 4,650,289, entitled OPTICAL CIRCULATOR, the entire disclosure of which is hereby incorporated by reference as if being set forth in its entirety herein may be used.

Waveguide wavelength demultiplexer 330 may be used to separate the incoming input signal into constituent parts for use in add/drop module 300. A multi-channel-input signal may be demultiplexed, separated spatially into different waveguide branches based on wavelength, for example. For example, if the incoming signal has a wavelength range $\lambda$, the demultiplexer may separate the signal into 6 equally sized branches, as may be seen in FIG. 3, each branch including signal of wavelength range $\lambda/6$. Demultiplexer 330 may take the form of an arrayed waveguide grating or echelle grating, for example. Such an arrayed waveguide grating or echelle grating combines and splits optical signals of different wavelengths utilizing a number of arrayed channel waveguides that act together like a diffraction grating offering high wavelength resolution and attaining narrow wavelength channel spacing. After being demultiplexed, each channel propagating a portion of the overall wavelength range may be aligned with one tunable distributed Bragg reflector 100 filter in an array 340 of electrically tunable narrow-band waveguide distributed Bragg reflector 100 filters.

Array 340 of tunable distributed Bragg reflectors 100 may include individual tunable distributed Bragg reflectors 100 as shown in FIG. 1 and discussed hereinabove. Each tunable distributed Bragg reflector 100 may operate as a tunable narrow-band reflective mirror and a tunable notch filter. When energy propagation reaches tunable distributed Bragg reflector 100, by controlling mechanically controllable membrane 150 aligned in one of the tunable distributed Bragg reflector 100, such as a MEMs or other suitable device, each may be configured according to whether the channel is desired to be added or dropped. For example, if a channel desiring to be dropped 350 is received at a filter 100, that filter 100 may be configured so as to pass this channel's signal, as a notch filter, for example. On the other hand, if the channel contains a signal desired to continue to propagate 360, i.e. not to be dropped, the filter will be configured so as to reflect this channel's signal, a narrow-band reflective mirror. Additionally, if a signal is desired to be added corresponding in wavelength with a signal to be dropped 370, or a previously substantially unused wavelength 380, this signal may be added by passing through the corresponding filter used to drop a portion of the signal. For either adding a previously unused wavelength or for adding a previously dropped wavelength, filter 100 may be configured so as to pass this signal to be added, as a notch filter, for example. In the case of adding a signal corresponding in wavelength to a signal to be dropped, filter 100 would already be configured to pass the wavelength in order to effectuate the signal drop discussed hereinabove. When the signal reaches filter 100, since filter 100 may be configured as a notch filter suitable to pass the signal, the signal may be transmitted through filter 100, thereby entering the system and passing through to the waveguide wavelength demultiplexer 330.

Wavelengths reflected or added at array 340 of tunable distributed Bragg reflectors 100 propagate through waveguide wavelength demultiplexer 330. Waveguide wavelength demultiplexer 330 operates to combine this returning energy back into a single energy propagation. This combined energy propagation propagates through to circulator 320 and is outputted through fiber 310.

Further, if an electrically tunable narrow-band waveguide distributed Bragg reflector 100 mirror/filter operates as a variable optical attenuator or variable optical reflector, then the above waveguide add/drop module 300 may be utilized as a dynamic gain equalization filter. Dynamic gain equalization may be necessary due to effects resulting from increasing bandwidth causing channel powers to become unbalanced. Non-uniformity of channel powers arises from non-linear effects such as Raman scattering in a communicative fiber and the cumulative effects of cascaded optical amplifiers. Further, in large systems, these effects may be pronounced. If the channel power imbalance is not mitigated, overall system performance may be degraded and service reliability may be reduced. Dynamic equalization eliminates gain tilt, gain shape changes, and accumulated spectral ripple that occurs due to dynamic changes in optical networks. It permits longer distance, higher bandwidth and light-path flexibility in optical transmission links with less frequent O-E-O regeneration.

Operatively, for example, the above waveguide add/drop module 300 may be configured, instead of substantially transmitting or reflecting the incoming signal as described hereinabove, to partially transmit and reflect the signal. By so doing, filter 100 may gain equalize the overall signal substantially equating the signal in each band.

As would be known to those possessing an ordinary skill in the pertinent arts, filter 100 may have a defined pass-band and an edge of the pass-band. In order to gain equalize, filter 100 may be set to pass a wavelength slightly offset from the wavelength propagating as described in the add/drop discussion, thereby utilizing the edge of the band as a partially transmitting/reflecting filter. Slight tuning of the offsets may be utilized to modify the amount of reflected signal, thereby being suitable for use in equalizing the signal reflected from filter 100 in each pass band. The amount of offset for a given pass band may be modified according to the incoming signal characteristics, varying the reflectance in a pass band as described herein, thereby adding a dynamic feature to the gain equalization.

Those of ordinary skill in the art will recognize that many modifications and variations of the present invention may be implemented without departing from the spirit or scope of the invention. Thus, it is intended that the present invention covers the modifications and variations of this invention provided they come within the scope of the appended claims and their equivalents.

What is claimed is:

1. A wavelength tunable active device for operating on at least a portion of energy propagating through a waveguide, said device comprising:

an upper cladding and a lower cladding having a core substantially disposed there between and suitable for being optically coupled to said waveguide;

a pattern of nanostructures positioned substantially on said upper cladding distal to said core so as to define a reflectivity for energy propagating through said waveguide; and, a movable membrane aligned with said pattern of nanostructures so as to at least partially define a gap there between;

wherein, said gap may be selectively controlled upon actuation of said movable membrane so as to cause a corresponding change in said reflectivity.

2. The device of claim 1, wherein said pattern of nanostructures comprises a periodic structure of nanostructures.

3. The device of claim 1, wherein said pattern of nanostructures is formed substantially from at least one of Si, InP, and GaAs.

4. The device of claim 1, wherein said pattern of nanostructures includes at least one pattern selected from the group consisting of holes, strips, trenches and pillars.

5. The device of claim 4, wherein said pattern has a common period.

6. The device of claim 1, wherein said pattern of nanostructures is one-dimensional.

7. The device of claim 1, wherein said pattern of nanostructures is two-dimensional.

8. The device of claim 1, wherein said pattern of nanostructures is formed of materials wherein the refractive index of said pattern of nanostructures is greater than the refractive index of said upper cladding.

9. The device of claim 1, wherein said upper cladding is formed substantially of at least one of $SiO_2$ and InP.

10. The device of claim 1, wherein said lower cladding is formed of substantially InP or $SiO_2$.

11. The device of claim 1, wherein said core is formed substantially of at least one of SiN and InGaAs.

12. The device of claim 1, wherein said movable membrane is a microelectromechanical system.

13. The device of claim 1, wherein said movable membrane is formed of substantially at least one of the group consisting of SiN, Si and $SiO_2$.

14. The device of claim 1, wherein the size of said gap is within the range 0.01 um to 1 um.

15. The device of claim 14, wherein the size of the gap is substantially 0.3 um.

16. The device of claim 1, wherein control of the size of gap by electro-mechanically actuating said movable membrane provides for wavelength selection of the device.

17. A monolithic tunable optical energy source suitable for emitting energy having at least one wavelength, said source comprising:

a gain portion suitable for amplifying said energy to be emitted;

at least a first reflector suitable for substantially reflecting the at least one wavelength comprising an upper cladding and a lower cladding having a core substantially disposed there between; a pattern of nanostructures positioned substantially on said upper cladding distal to said core so as to define a reflectivity for propagating energy; and, a movable membrane aligned with said pattern of nanostructures so as to at least partially define a gap there between; wherein, said gap may be selectively controlled upon actuation of said movable membrane so as to cause a corresponding change in said reflectivity; and, a waveguide portion substantially optically coupling said first reflector with said gain portion.

18. The source of claim 17, further comprising a second reflector located adjacent to said gain portion distal from said first reflector.

19. The source of claim 18, wherein said second reflector reflects a first portion of the propagating energy back through said gain portion and transmits a second portion of the propagating energy.

20. The source of claim 19, wherein said transmitted second portion is approximately one percent of the propagating energy.

21. The source of claim 17, wherein said gain portion is of the form of a Type III–V semiconductor compound.

22. The source of claim 21 wherein said gain portion is formed substantially of at least one of GaAs and InGaAsP.

23. The source of claim 17 wherein said gain portion operates to maintain more excited or pumped atoms in higher energy levels than atoms existing in the lower energy levels.

24. The source of claim 23, wherein said gain portion is energized by energy of a wavelength selected by said first reflector and propagating through said gain portion.

25. The source of claim 23, wherein a second reflector is optically coupled with said first reflector thereby creating an energy oscillator.

26. The source of claim 25, wherein said second reflector transmits a portion of the propagating energy, thereby creating a laser emission of the wavelength selected by said first reflector.

27. The source of claim 25, wherein said second reflector and said first reflector are substantially associated with the wavelength of the oscillating energy.

28. The source of claim 27, wherein said second reflector transmits a portion of the propagating energy, thereby creating a laser emission of the wavelength selected by said first reflector and said second reflector.

29. A waveguide module suitable for interacting with input energy propagation utilizing a wavelength tunable device, the waveguide module comprising:

a waveguide wavelength demultiplexer suitable for dividing the energy propagation into parts, each part comprising approximately an equal wavelength portion of said energy propagation; and, a plurality of reflectors suitable for interacting with the divided energy propagation, each reflector comprising an upper cladding and a lower cladding having a core substantially disposed there between and suitable for being optically coupled to said waveguide wavelength demultiplexer; a pattern of nanostructures positioned substantially on said upper cladding distal to said core so as to define a reflectivity for the energy propagating through said waveguide wavelength demultiplexer; and, a movable membrane aligned with said pattern of nanostructures so as to at least partially define a gap there between; wherein, said gap may be selectively controlled upon actuation of said movable membrane so as to cause a corresponding change in said reflectivity, suitable for determining the add/drop characteristics of operating wavelength portion.

30. The module of claim 29, further comprising a circulator optically coupled to said waveguide wavelength demultiplexer, said circulator being suitable for input and output coupling.

31. The module of claim 30, wherein said circulator comprises a number of ports identified in a specific sequence, and wherein said circulator substantially outputs energy input through one port through the next port in the sequence.

32. The module of claim 29, wherein said waveguide wavelength demultiplexer includes an arrayed waveguide grating.

33. The module of claim 29, wherein said waveguide wavelength demultiplexer includes an echelle grating.

34. The module of claim 29, wherein said plurality of reflectors includes at least one reflector suitable for use as a tunable narrow-band reflective mirror.

35. The module of claim 29, wherein said plurality of reflectors includes at least one reflector suitable for use as a tunable notch filter.

36. The module of claim 29, wherein at least one of said plurality of reflectors substantially transmits wavelengths to be dropped from the module.

37. The module of claim 29, wherein at least one of said plurality of reflectors substantially reflects wavelengths continuing to propagate.

38. The module of claim 29, wherein at least one of said plurality of reflectors is configured to transmit a previously substantially unused wavelength, thereby injecting this wavelength into the system.

39. The module of claim 29, wherein at least one of said plurality of reflectors substantially operates as a variable optical attenuator, the module thereby being suitable for use as a dynamic gain equalization filter.

* * * * *